United States Patent
Takahashi

[11] Patent Number: 6,031,724
[45] Date of Patent: Feb. 29, 2000

[54] IC CARD AND METHOD OF MANUFACTURING THE SAME

[75] Inventor: Takuya Takahashi, Yokohama, Japan

[73] Assignee: Kabushiki Kaisha Toshiba, Kawasaki, Japan

[21] Appl. No.: 08/563,278

[22] Filed: Nov. 28, 1995

[30] Foreign Application Priority Data

Nov. 29, 1994 [JP] Japan .................................. 6-295235

[51] Int. Cl.[7] .............................. H05K 1/14; H01L 23/32
[52] U.S. Cl. ........................ 361/737; 361/758; 235/492; 257/679
[58] Field of Search ...................................... 361/736, 737, 361/740–742, 745, 747–749, 752–754, 756, 758–759, 770, 801–803, 820; 235/380, 492, 441, 435, 487; 257/679; 439/946

[56] References Cited

U.S. PATENT DOCUMENTS

| | | |
|---|---|---|
| 4,264,917 | 4/1981 | Ugon . |
| 4,703,420 | 10/1987 | Irwin . |
| 4,804,828 | 2/1989 | Oogita ........................................ 235/10 |
| 4,837,628 | 6/1989 | Sasaki . |
| 4,843,225 | 6/1989 | Hoppe ...................................... 235/492 |
| 4,882,702 | 11/1989 | Struger et al. . |
| 4,916,662 | 4/1990 | Mizuta . |
| 4,943,464 | 7/1990 | Gloton et al. . |
| 4,980,856 | 12/1990 | Ueno . |
| 5,018,017 | 5/1991 | Sasaki et al. . |
| 5,036,429 | 7/1991 | Kaneda et al. . |
| 5,153,818 | 10/1992 | Mukougawa et al. . |
| 5,172,338 | 12/1992 | Mehrotra et al. . |
| 5,184,282 | 2/1993 | Kaneda et al. . |
| 5,272,374 | 12/1993 | Kodai et al. . |
| 5,292,236 | 3/1994 | Adachi et al. . |
| 5,297,029 | 3/1994 | Nakai et al. . |
| 5,297,148 | 3/1994 | Harari et al. . |
| 5,299,089 | 3/1994 | Le Roux . |
| 5,343,319 | 8/1994 | Moore . |
| 5,388,084 | 2/1995 | Itoh et al. . |
| 5,430,859 | 7/1995 | Norman et al. . |
| 5,438,359 | 8/1995 | Aoki . |
| 5,457,590 | 10/1995 | Barrett et al. . |
| 5,469,399 | 11/1995 | Sato et al. . |
| 5,475,441 | 12/1995 | Parulski et al. . |
| 5,488,433 | 1/1996 | Washino et al. . |
| 5,508,971 | 4/1996 | Cernea et al. . |
| 5,509,018 | 4/1996 | Niijima et al. . |
| 5,535,328 | 7/1996 | Harari et al. . |
| 5,550,709 | 8/1996 | Iwasaki . |
| 5,563,825 | 10/1996 | Cernea et al. . |
| 5,566,105 | 10/1996 | Tanaka et al. . |
| 5,568,424 | 10/1996 | Cernea et al. . |
| 5,572,466 | 11/1996 | Sukegawa . |
| 5,572,478 | 11/1996 | Sato et al. . |
| 5,584,043 | 12/1996 | Burkart . |

(List continued on next page.)

FOREIGN PATENT DOCUMENTS

| | | |
|---|---|---|
| 0 214 478 | 3/1987 | European Pat. Off. . |
| 1-145197 | 6/1989 | Japan . |
| 4-16396 | 1/1992 | Japan . |

*Primary Examiner*—Leo P. Picard
*Assistant Examiner*—Jayprakash N. Gandhi
*Attorney, Agent, or Firm*—Finnegan, Henderson, Farabow, Garrett & Dunner, L.L.P.

[57] ABSTRACT

An IC card includes a card-like substrate, an IC module, and an adhesive. The substrate is made of synthetic resin and has in one surface a hole for fixing the IC module. The IC module has a circuit board on which an IC chip is mounted and sealed with resin. The back side of the circuit board is provided with external connecting terminals which are electrically connected to the IC chip and exposed from the card-like substrate. The IC module is fitted into the hole of the card-like substrate such that an IC chip mounting section of the IC module is located inside the IC card. Using the adhesive, the IC module is fixed onto part of the inner surface of the hole of the card-like substrate without causing the chip mounting section to contact the inner surface of the hole.

5 Claims, 3 Drawing Sheets

U.S. PATENT DOCUMENTS

| | | |
|---|---|---|
| 5,592,420 | 1/1997 | Cernea et al. . |
| 5,596,532 | 1/1997 | Cernea et al. . |
| 5,602,987 | 2/1997 | Harari et al. . |
| 5,608,673 | 3/1997 | Rhee . |
| 5,611,057 | 3/1997 | Pecone et al. . |
| 5,615,344 | 3/1997 | Corder . |
| 5,621,685 | 4/1997 | Cernea et al. . |
| 5,638,321 | 6/1997 | Lee et al. . |
| 5,663,901 | 9/1997 | Wallace et al. . |
| 5,671,229 | 9/1997 | Harari et al. . |
| 5,693,570 | 12/1997 | Cernea et al. . |
| 5,887,145 | 3/1999 | Harari et al. . |

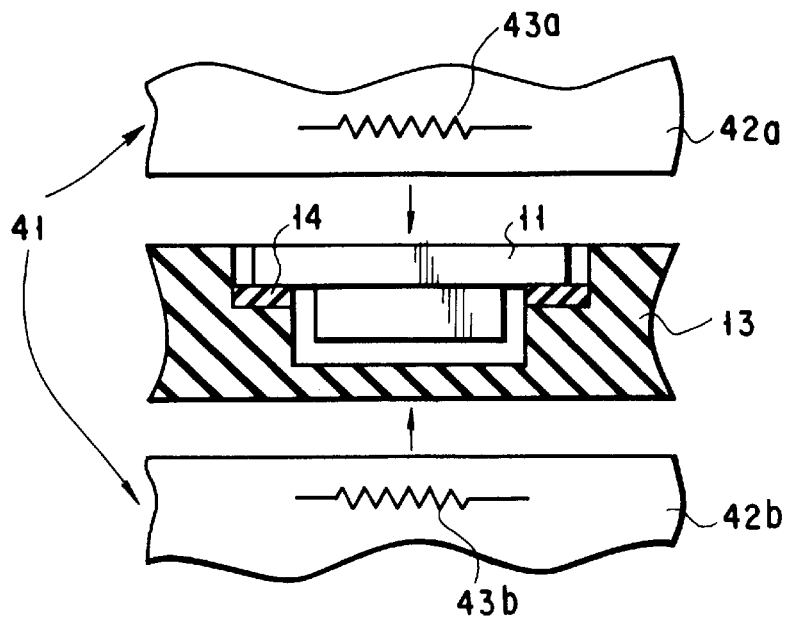
F I G. 11
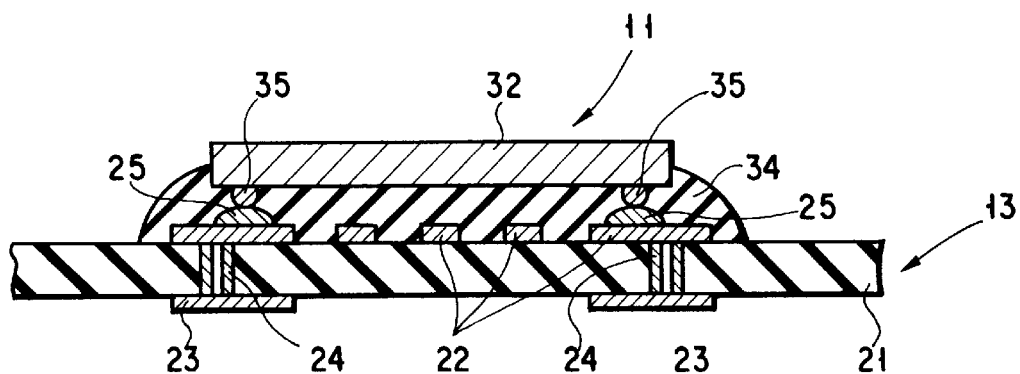
F I G. 12
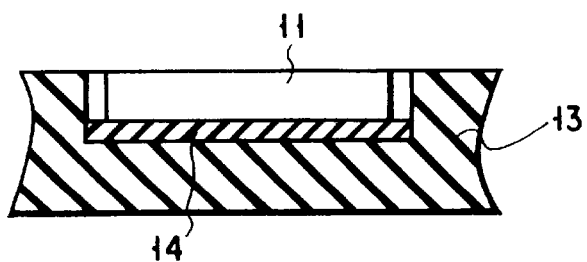
F I G. 13

IC CARD AND METHOD OF MANUFACTURING THE SAME

BACKGROUND OF THE INVENTION

1. Field of the Invention

The present invention relates to an IC card including a semiconductor integrated circuit (IC) and a method of manufacturing the same and, more particularly, to the structure of an IC card having on its surface a terminal for externally connecting an IC and a method of fixing an IC module.

2. Description of the Related Art

Recently there have been demands for increasing an amount of information to be written to a magnetic stripe card in accordance with various uses for the card. To dishonestly use or rewrite the written information has become social problems accordingly.

In view of the above problems, an IC card incorporating an IC has been widely used in place of the magnetic stripe card.

Conventionally, there are an IC card having a fitting structure of fitting an IC module into a hole of a card-like substrate made of synthetic resin and an IC card having a laminated structure of laminating an inner sheet, an over sheet and the like and burying an IC module into a hole of these laminated sheets.

The IC module has various structures: a structure wherein an LSI bare chip, bonded to leads on a resin tape, is sealed, a chip on board (COB) structure wherein an LSI bare chip is formed on a circuit board by die bonding to connect pads of the bare chip and wires on the circuit board by gold wire bonding, a flip chip structure wherein an LSI bare chip is formed on a circuit board by die bonding to connect pads of the bare chip and those on the circuit board through bump electrodes, etc. Various types of single-sided resin sealed IC module capable of easily thinning and miniaturizing an IC card are also proposed.

An IC card such as an X-6303 IC card of JIS (Japanese Industrial Standard) and a 7813 IC card of ISO (International Standard Organization), can be achieved by fitting an IC module, which has a circuit board from the back side of which an external connecting terminal is projected, into a hole of a card-like substrate. More specifically, the IC module is fitted into the hole by an adhesive such that an IC chip mounting section is located inside the IC card.

The above-described IC card has a drawback wherein the card is damaged by stress concentrated upon an end corner portion of the IC chip mounting section when the card is bent and deformed.

Further, there is a drawback of low mass production in a conventional method of manufacturing an IC card wherein a liquid adhesive is applied onto the inner surface of a hole of a card-like substrate, and an IC module is fitted into the hole and pressed on the inner surface thereof such that an IC chip mounting section of the IC module is located inside the card.

SUMMARY OF THE INVENTION

An object of the present invention is to provide an IC card capable of preventing a damage from being caused in an end corner portion of an IC chip mounting section of an IC module when the card is bent and deformed.

Another object of the present invention is to provide a method of manufacturing an IC card capable of improving in mass production by fitting an IC module of a card-like substrate into a hole such that an IC chip mounting section of the IC module is located inside the IC card.

According to a first aspect of the present invention, there is provided an IC card comprising:

a card-like substrate having a first surface and a second surface opposite thereto, the first surface including a hole having a predetermined depth;

an IC module including an IC chip mounting section having an IC chip to be sealed with synthetic resin, the IC module being fitted into the hole of the card-like substrate such that the IC chip mounting section is located inside the IC card; and an adhesive for fixing the IC module onto part of an inner surface of the hole of the card-like substrate without causing the IC chip mounting section to contact the inner surface of the hole.

According to a second aspect of the present invention, there is provided a method of manufacturing an IC card, comprising the steps of:

preparing a card-like substrate having a first surface and a second surface opposite thereto, the first surface having a hole;

preparing an IC module including an IC chip mounting section having an IC chip to be sealed with synthetic resin;

placing an adhesive on part of an inner surface of the hole of the card-like substrate without causing the IC chip mounting section to contact the inner surface of the hole when the IC module is fixed into the hole;

fitting the IC module into the hole of the card-like substrate such that the IC chip mounting section is located inside the IC card; and bonding the IC module to the card-like substrate by pressing the IC module and the card-like substrate on each other by pressing means, the IC module and the card-like substrate being interposed between the pressing means.

According to a third aspect of the present invention, there is provided an IC card comprising:

a card-like substrate having a first surface and a second surface opposite thereto, and a hole in the first surface, the hole including a first hole portion having a first area and a second hole portion having a second area which is smaller than the first area;

an IC module including an IC chip mounting section having an IC chip to be sealed with synthetic resin and having a shape suitable for the second hole portion of the hole of the card-like substrate, the IC module being fitted into the hole of the card-like substrate such that the IC chip mounting section is located inside the IC card; and an adhesive provided a bottom of the first hole portion of the card-like substrate excluding the second hole portion, for fixing the IC module to the card-like substrate.

In the IC card of the present invention, the IC module is fixed onto part of the inner surface of the hole of the card-like substrate without causing the IC chip mounting section to contact the inner surface of the hole. Thus, even when the card-like substrate is bent and warped to cause an inner stress, the stress is not concentrated upon a thin portion (which is opposite to the IC mounting section) of the IC card or the portion is not likely to be damaged (cracked or the like), with the result that the IC card increases in mechanical strength.

In the method of manufacturing the IC card of the present invention, since the sheet-like adhesive is used to fix the IC module, the time required for doing it can be shortened and it is easy to handle, as compared with the case of the liquid adhesive. Moreover, it is unlikely that the sheet-like adhesive will leak (rise) outwardly from a gap between the inner surface of the hole and the IC module when the IC module is fitted into and pressed on the hole. It is thus unnecessary to accurately control the position in placing the adhesive on the inner surface of the hole, resulting in improvement in mass production and reduction in manufacturing cost.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 11 is a partly cross-sectional view showing a step subsequent to the step shown in FIG. 10;

FIG. 12 is a cross-sectional view showing another IC module usable in the IC card of the present invention; and FIG. 13 is a partly cross-sectional view showing part of an IC card according to a second embodiment of the present invention.

DETAILED DESCRIPTION OF THE PREFERRED EMBODIMENTS

Figure 1:
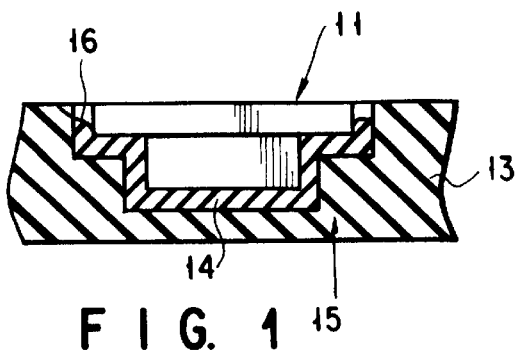
FIG. 1 is a partly cross-sectional view showing part of an IC card.
Figure 2:
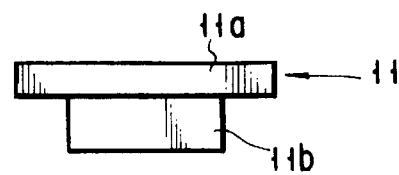
FIG. 2 is a side view of an IC module of the IC card shown in FIG. 1.
Figure 3:
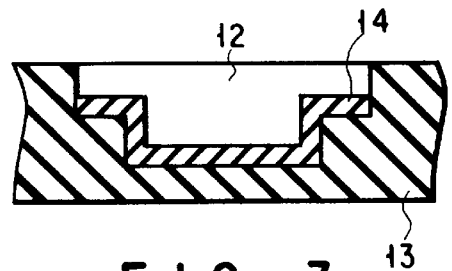
FIG. 3 is a cross-sectional view of a card-like substrate of the IC card shown in FIG. 1.

FIGS. 1 to 3 show a currently-used IC card having on its surface a terminal for externally connecting an IC. The IC card includes an IC module 11, a card-like substrate 13 made of synthetic resin and having a hole 12 through which the IC module 11 is inserted. The IC module 11 is fixed into the hole 12 by an adhesive 14.

As illustrated in FIG. 2, the IC module 11 includes a circuit board 11a and an IC chip mounting section 11b formed by mounting an IC chip (not shown) on one side of the circuit board 11a and sealing it with resin. An external connecting terminal (not shown) is provided on the back side of the circuit board 11a.

The IC module 11 is fixed into the card-like substrate 13 as follows. As shown in FIG. 3, the liquid adhesive 14 is applied onto the inner surface of the hole 12 of the board 13, and the IC module 11 is fitted into the hole 12 and pressed thereon such that the external connecting terminal is exposed from the surface of the IC card and the IC chip mounting section is located inside the card, with the result that the IC module 11 is fixed onto the inner surface of the hole 12 by the adhesive 14.

In the IC card shown in FIG. 1, the IC chip mounting section 11b is fixed to the substrate 13 by the adhesive 14 and is too hard to be deformed. Therefore, when the substrate 13 is bent and warped to cause an internal stress, the stress is concentrated on an end corner portion 15 of the IC chip mounting section 11b.

Since the corner portion 15 is the thinnest in the IC card, it is damaged (e.g., cracked); therefore, the mechanical strength of the IC card shown in FIG. 1 is not so high.

Since, as described above, the liquid adhesive 14 is applied onto the inner surface of the hole 12 of the substrate 13, a long time is required for fixing the IC module 11 thereinto. When the IC module 11 is pressed on the inner surface of the hole 12, the liquid adhesive 14 is likely to leak (rise) from a gap 16 between the inner surface of the hole 12 and the IC module 11. To prevent this phenomenon, the positions of an adhesive supply dispenser and an IC module mounter (neither of which is shown) need to be accurately controlled when the adhesive 14 is applied to the inner surface of the hole 12. In this respect, the foregoing currently used IC card cannot be mass-produced too much.

When a thermosetting adhesive or a self-heating adhesive is used, it is likely that the card-like substrate will be warped because of the hole of the substrate. In this respect, too, the currently used IC card is decreased in mass production.

Embodiments of the present invention will now be described.

Figure 4:
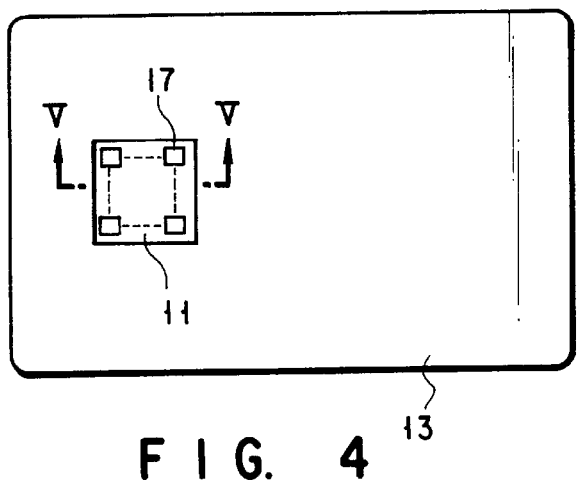
FIG. 4 is a front view of an IC card according to a first embodiment of the present invention.

FIG. 4 shows the constitution of the entire IC card according to an embodiment of the present invention. A hole 12 (not shown in FIG. 4) is formed in one surface of a card-like substrate 13, and an IC module 11 having a circuit board and an IC chip mounting section 11b (not shown in FIG. 4) is fitted into the hole. A plurality of external connecting terminals 17 are arranged on that surface of the IC module 11 is exposed.

Figure 5:
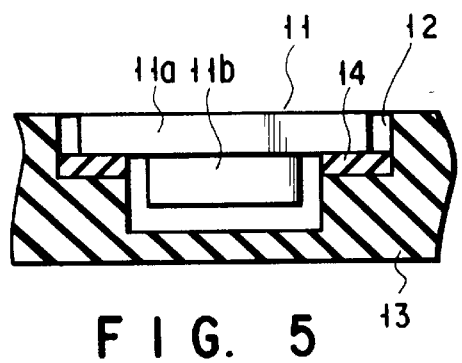
FIG. 5 is a partly cross-sectional view taken along line V—V of FIG. 4.

FIG. 5 is a partly cross-sectional view of the IC card shown in FIG. 4. As shown in FIG. 5, the IC module 11 is fitted into the hole 12 of the substrate 13, and the IC module is fixed onto the substrate 13 using a thermo-compression type sheet-like adhesive 14. More specifically, the IC module 11 is fixed on part of the inner surface of the hole 12 so as to prevent the IC chip mounting section 11b from contacting the inner surface of the hole 12. In other words, the IC module 11 is fixed into the hole such that it contacts only the periphery of the IC chip mounting section 11b.

Figure 6:
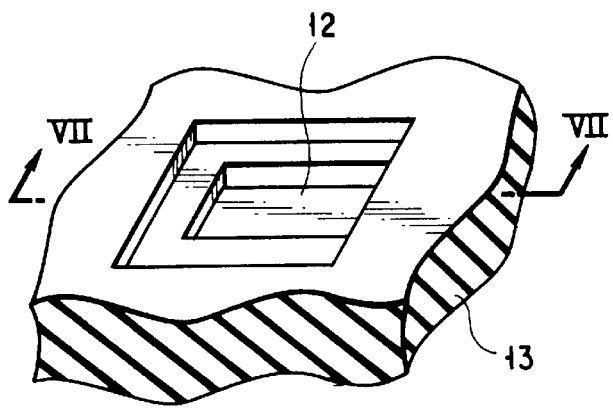
FIG. 6 is a perspective view of a card-like substrate of the IC card shown in FIG. 4.
Figure 7:
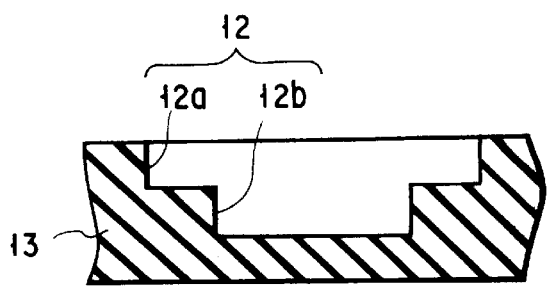
FIG. 7 is a cross-sectional view taken along line VII—VII of FIG. 6.

FIGS. 6 and 7 show in detail the constitution of the card-like substrate 13 of the IC card shown in FIGS. 4 and 5. The substrate 13 is a plate-like substrate made of synthetic resin. The substrate 13 has one surface and its opposite surface, and the IC module fitting hole 12 is provided in part of the one surface of the substrate 13. The hole 12 includes a first hole 12a having a first area and a second hole 12b having a second area which is smaller than the first area of the first hole 12a. In other words, the hole 12 is shaped like a reversed convex.

Figure 8:
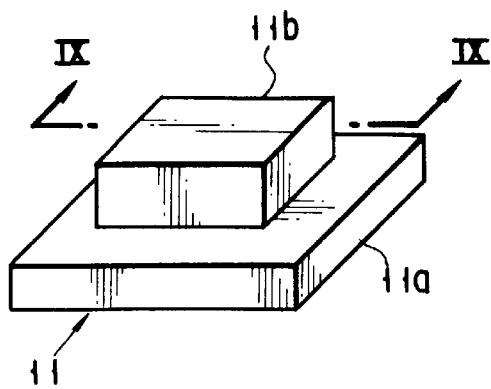
FIG. 8 is a perspective view of an IC module of the IC card shown in FIG. 4.
Figure 9:
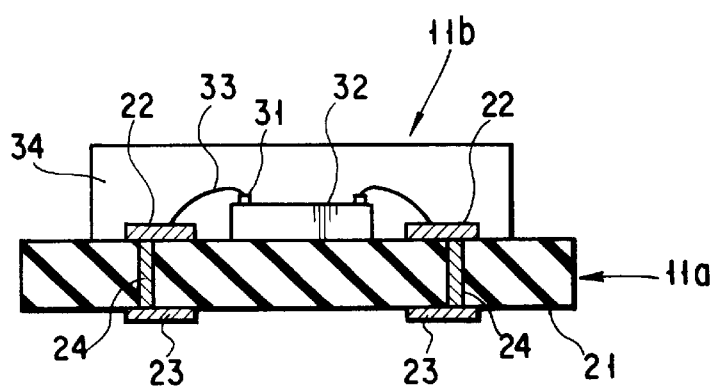
FIG. 9 is a cross-sectional view taken along line IX—IX of FIG. 6.

FIGS. 8 and 9 show in detail the constitution of the IC module 11 shown in FIGS. 4 and 5. The entire IC module 11 has an outward appearance of a convex as shown in FIG. 8, and the IC chip mounting section 11b of the module 11 is shaped so as to be fitted into the second hole 12b of the substrate 13. As illustrated in FIG. 9, the circuit board 11a includes a wiring substrate 21, a plurality of connecting pads 22 provided on one surface of the wiring substrate 21, a plurality of external connecting terminals 23 provided on the other surface of the substrate 21, and through-hole wirings 24 for connecting the pads 22 and terminals 23. The IC chip mounting section 11b includes an IC chip 32 fixed onto the one surface of the wiring substrate 21 and having a plurality of connecting pads 31 thereon, bonding wires 33 for electrically connecting the pads 31 and the pads 22, and a synthetic resin layer 34 for sealing the IC chip 32, bonding wires 33 and the like.

The IC card having the above constitution is manufactured by the following process.

First a card-like substrate 13 and an IC module 11 are prepared by the following normal method. As shown in FIGS. 6 and 7, the substrate 13 is made of synthetic resin and has an IC module fixing hole in one surface thereof. As shown in FIGS. 8 and 9, the IC module 11 includes a circuit board 11a, an IC chip mounted on the circuit board and sealed with resin, and external connecting terminals formed on the undersurface of the circuit board and electrically connected to the IC chip.

Figure 10:
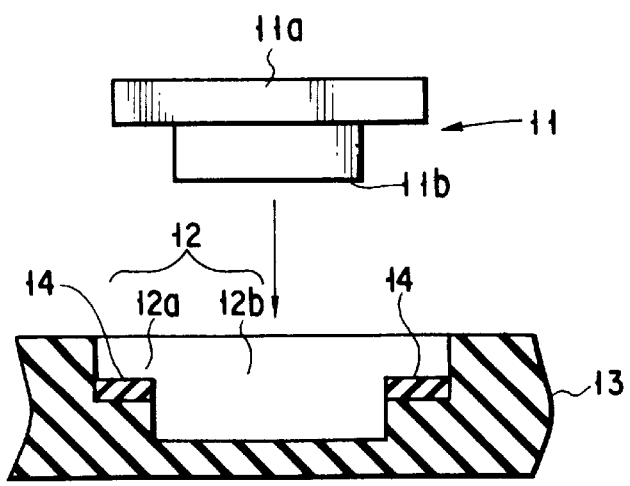
FIG. 10 is a partly cross-sectional view showing one of steps of manufacturing the IC card shown in FIG. 4.

To mount the IC module 11 on the card-like substrate 13, as shown in FIG. 10, a thermo-compression bonding type sheet-like adhesive 14 is placed on that part of the inner surface of a hole 12 of the substrate 13 which does not contact an IC chip mounting section 11b of the IC module 11. For example, the part corresponds to the bottom of a first hole 12a, not including a portion where a second hole 12b is to be formed.

Then, as illustrated in FIG. 11, the IC module 11 is fitted into the hole 12 of the substrate 13 such that the external connecting terminals (shown in FIG. 9) of the IC module 11 are exposed from the substrate 13 and the IC chip mounting section 11b thereof is located inside the IC card.

After that, the IC module 11 and card-like substrate 13 are thermally pressed on each other by a heating press machine 41 including a first pressure plate 42a having a first heater 43a and a second pressure plate 42b including a second heater 43b, and the adhesive is thermally compressed, thereby to fix the IC module 11 onto the substrate 13. Even though the IC module 11 itself is warped, this warp can be corrected forcibly; therefore, bad contact of the IC card due to the warp can be diminished.

When the IC module 11 is pressed by heat, it is desirable to have a difference in heating temperature between the two heaters. More specifically, the heating temperature of the first heater 43a is set slightly higher than that of the second heater 43b in order to prevent the card-like substrate 13 from being warped or decreased in bonding due to the shape of the IC card and the hole of the substrate 13. The heat contraction of one card surface on the circuit board side can thus be made greater than that of another card surface opposite thereto.

Since the IC module 11 is fixed onto part of the inner surface of the hole 12 of the substrate 13 without causing the IC chip mounting section 11b to contact the inner surface, the IC card of the above embodiment has the following advantages as compared with the case where an IC chip mounting section is fixed onto the inner surface of a hole by an adhesive.

(1) Even when the card-like substrate is bent and warped to cause an internal stress, the stress is not concentrated upon a thin portion (which is opposite to the IC mounting section) of the IC card or the portion is not likely to be damaged (cracked or the like). The IC card thus increases in mechanical strength and, in other words, the mechanical strength can be improved without modifying the material or shape of the card-like substrate.

(2) The manufacturing cost of the IC card can be lowered as the amount of adhesive to be used decreases.

(3) The yield of the card-like substrate is improved since the card-like substrate is hardly warped when the adhesive is hardened.

The method of manufacturing the IC module according to the above embodiment has the following advantages as compared in the case where a liquid adhesive is employed, since the sheet-like adhesive is used in order to fix the IC module.

(1) The time required for fixing the IC module can be shortened.

(2) The thickness of the adhesive can be almost fixed and so can be that of the IC card. The yield of the IC card can thus be improved.

(3) Since the amount of the liquid adhesive can be almost fixed, it is unlikely that the adhesive will leak (rise) outwardly (toward the card surface) from a gap between the inner surface of the hole and the IC module when the IC module is fitted into and pressed on the hole. It is thus unnecessary to accurately control the position of the mounter in order to place the adhesive on the inner surface of the hole.

(4) Since there is not much fear that the adhesive will be separated from the inner surface of the hole even when the card-like substrate is bent and warped, the IC card can be improved in reliability.

(5) Since the number of characteristic parameters of the adhesive is small in the manufacturing process (e.g., pressure and temperature only), the process can easily be controlled.

With the above advantages of the manufacturing method, mass-production can be increased and manufacturing cost can be decreased.

The IC card of the above embodiment satisfies the mechanical strength prescribed in, e.g., the JIS. However, the present invention is not limited to such a card, but can be applied to various types of IC card which includes an IC module fitted into a hole of a card-like substrate and an external connecting terminal on the surface thereof.

According to the above embodiment, the sheet-like adhesive is provided so as not to contact the IC chip mounting section of the IC module. However, the IC module can be fitted into and pressed on the hole using a liquid adhesive in place of the sheet-like adhesive. In this case, even if the amount of adhesive to be applied is somewhat varied, the adhesive flows into a deep portion of the hole having a reversed convex section and thus the adhesive is not likely to leak (rise) outwardly (to the card surface) from the hole. Therefore, a margin for the amount of adhesive to be applied is extended, and the IC module can be stably mounted.

In the above embodiment, the IC module has the section as shown in FIG. 9. However, an IC module having the structure as shown in FIG. 12 can be used for the present invention. The IC module shown in FIG. 12 has a single-sided resin sealed type package structure and includes a wiring substrate 21, an IC chip 32, a resin layer 34, and external connecting terminals 23. Wirings 22, which include to-be-connected portions or connecting pads 25 made of silver paste, are formed on one major surface of the substrate 21. The IC chip 32 is mounted on the major surface of the substrate 21 with its face down. The resin layer 34 is interposed between the chip 32 and wiring substrate 21 to cover the side portions of the chip 32. The terminals 23 are extended from the connecting pads 25 via, e.g., through-hole wirings 24 and exposed to the other major surface of the substrate 21.

As one example of a method for fixing the substrate 21 and IC chip 32 to each other in the IC module shown in FIG. 12, at least end portions of bump electrodes 35 formed on the connecting pads of the IC chip 32 are fixedly buried into the connecting pads 25 of the substrate 21 and, in this state, the silver paste of the connecting pads 25 are thermally hardened, thereby bonding the bump electrodes 35 and connecting pads 25 to each other.

Since the exposed upper surface of the IC chip 32 is formed of close, solid materials, such as silicon, a great problem does not occur with reliability even though the chip 32 is not sealed with resin. While the substrate 21 is 15 mm in length and breadth and 0.2 mm in thickness, the IC chip 32 is 13 mm in length and breadth and 0.25 mm in thickness.

Furthermore, in the IC card of the above embodiment, the convex IC module is fitted into the hole having a reversed convex section. However, in an IC card having a structure of fitting a plate-like IC module 11 into a hole having a square section, as illustrated in FIG. 13, a sheet-like adhesive 14 can be placed on the inner surface of the hole so as to contact one side of the IC module 11 thereby to fix the IC module into the hole.

According to the above-described IC card of the present invention, even when the card is bent and deformed, a damage can be prevented from being caused in an end corner portion of the IC chip mounting section, resulting in improvement in reliability.

According to the foregoing method of manufacturing the IC card of the present invention, the IC module is fitted into the hole of the card-like substrate such that the IC chip mounting section of the IC module is located inside the card, with the result that the IC card can be improved in mass production and in reliability.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An IC card comprising:
    a card-like substrate having a first surface and a second surface opposite thereto, and a hole in the first surface, said hole including a first hole portion having a first area and a first bottom of a first depth and a second hole portion having a second area which is smaller than the first area and a second bottom of a second depth which is greater than the first depth;
    an IC module including a circuit board and an IC chip mounting section formed on one side of the circuit board, said IC chip mounting section having an IC chip sealed with synthetic resin and having a shape suitable for the second hole portion of the hole of said card-like substrate, said IC module being fitted into the hole of said card-like substrate such that the IC chip mounting section is located inside the IC card, thereby producing a gap between an end portion of the circuit board and an inner surface of the first hole portion; and
    a sheet-like adhesive provided on the first bottom of the first hole portion of said card-like substrate excluding the second hole portion, for fixing said IC module to said card-like substrate, an end portion of said adhesive contacting the inner surface of the first hole portion.

2. The IC card according to claim 1, wherein said IC chip has a first surface and a second surface opposite thereto, a plurality of electrodes being formed on the first surface of said IC chip, and said circuit board having a first surface and a second surface opposite thereto, the first surface of said circuit board being fixed onto the second surface of said IC chip, and the second surface of said circuit board being provided with a plurality of external connecting terminals electrically connected to a plurality of electrodes formed on the first surface of said IC chip.

3. The IC card according to claim 1, wherein said IC module has a convex section.

4. The IC card according to claim 1, wherein said adhesive is a thermo-compression bonding adhesive.

5. The IC card according to claim 1 wherein said card-like substrate is made of synthetic resin.

* * * * *